(12) United States Patent
Ge et al.

(10) Patent No.: US 10,266,940 B2
(45) Date of Patent: Apr. 23, 2019

(54) AUTO CAPACITANCE TUNER CURRENT COMPENSATION TO CONTROL ONE OR MORE FILM PROPERTIES THROUGH TARGET LIFE

(71) Applicant: APPLIED MATERIALS, INC., Santa Clara, CA (US)

(72) Inventors: Zhenbin Ge, San Jose, CA (US); Vivek Gupta, Fremont, CA (US); Adolph Miller Allen, Oakland, CA (US); Ryan Hanson, Cupertino, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 242 days.

(21) Appl. No.: 15/050,409

(22) Filed: Feb. 22, 2016

(65) Prior Publication Data

US 2016/0244874 A1  Aug. 25, 2016

Related U.S. Application Data

(60) Provisional application No. 62/119,776, filed on Feb. 23, 2015.

(51) Int. Cl.
*C23C 14/34* (2006.01)
*C23C 14/54* (2006.01)
(Continued)

(52) U.S. Cl.
CPC ............ *C23C 14/345* (2013.01); *C23C 14/54* (2013.01); *H01J 37/32174* (2013.01);
(Continued)

(58) Field of Classification Search
CPC ................ C23C 14/54; H01J 37/32174; H01J 37/32183
See application file for complete search history.

(56) References Cited

U.S. PATENT DOCUMENTS

2008/0237031 A1* 10/2008 Sato .................. H01J 37/32082
204/164
2011/0209995 A1  9/2011 Rasheed et al.
(Continued)

OTHER PUBLICATIONS

International Search Report and Written Opinion dated Jun. 20, 2016 for PCT Application No. PCT/US2016/019108.

*Primary Examiner* — Jason Berman
(74) *Attorney, Agent, or Firm* — Moser Taboada; Alan Taboada (57) ABSTRACT

In some embodiments a method of depositing a metal-containing layer atop a substrate disposed in a physical vapor deposition (PVD) chamber includes: providing a plasma forming gas to a processing region of the PVD chamber; providing a first amount of RF power to a target assembly disposed opposite the substrate to form a plasma within the processing region of the PVD chamber; sputtering source material from the target assembly to deposit a metal-containing layer onto the substrate, wherein the source material is at a first erosion state; and tuning an auto capacitance tuner coupled to a substrate support while sputtering source material to maintain an ion energy at a surface of the substrate within a predetermined range as the target erodes from the first erosion state to a second erosion state.

20 Claims, 4 Drawing Sheets

(51) Int. Cl.
*H01J 37/32* (2006.01)
*H03J 7/04* (2006.01)
*H03L 7/06* (2006.01)

(52) U.S. Cl.
CPC .......... *H01J 37/32183* (2013.01); *H03J 7/04* (2013.01); *H03L 7/06* (2013.01)

(56) References Cited

U.S. PATENT DOCUMENTS

| | | |
|---|---|---|
| 2011/0259851 A1 | 10/2011 | Brouk et al. |
| 2013/0192980 A1* | 8/2013 | Ge ................... H01J 37/32706 204/192.12 |
| 2013/0199925 A1 | 8/2013 | Cao et al. |
| 2014/0174909 A1* | 6/2014 | Klimczak ........... H01J 37/3405 204/192.11 |
| 2014/0216922 A1 | 8/2014 | Ritchie |
| 2014/0251789 A1 | 9/2014 | Miller |
| 2015/0002018 A1 | 1/2015 | Lill et al. |
| 2015/0252467 A1 | 9/2015 | Allen et al. |

* cited by examiner

AUTO CAPACITANCE TUNER CURRENT COMPENSATION TO CONTROL ONE OR MORE FILM PROPERTIES THROUGH TARGET LIFE

CROSS-REFERENCE TO RELATED APPLICATIONS

This application claims benefit of U.S. provisional patent application Ser. No. 62/119,776, filed Feb. 23, 2015, which is herein incorporated by reference in its entirety.

FIELD

Embodiments of the present disclosure generally relate to substrate processing systems.

BACKGROUND

High density, low stress films, for example titanium nitride (TiN) films, for Back End of Line (BEOL) hard mask applications are used to reduce line bending for patterned low-k dielectric trenches as well as to improve low-k etching profiles by reducing line edge roughness and critical dimension (CD) variation.

Radio frequency (RF) power may be supplied to a predominantly DC plasma to increase the ionization rate of sputtered material in the plasma. The increased ionization rate allows for improved surface mobility of arriving atoms, resulting in a crystallographic film orientation that is advantageous to producing low stress and dense films. In addition, a high fraction of ionized material arriving at the substrate level allows for tuning of the incoming ion energy by means of a wafer pedestal impedance circuit.

The RF power is supplied in parallel at the chamber cathode (i.e. sputtering target). A magnetron is used for increased electron confinement at the target surface to improve plasma stability and sputter rate. An erosion track is established on the surface of the target where material is preferentially sputtered.

One drawback of using RF power supplied to the target in conjunction with magnetic confinement at the target surface is that the effectiveness of the RF power delivery is diminished as the target material erodes. The effectiveness of the RF power delivery is diminished as the target material erodes due to the fact that the physical distance from the surface of the magnet to the sputtering surface of the target decreases as the target thins. Additionally, the erosion track on the surface of the target further reduces the effectiveness of the RF power delivery as the erosion track can further confine the electrons and thus decreases the plasma density at the substrate level. As the magnetic confinement increases, the electrons supplied by the RF current cannot propagate as efficiently into the plasma as they follow the strengthening (as a function of erosion depth) magnetic field lines.

The reduction in RF power delivered to the plasma reduces the ionization rate as seen directly by a decrease in the current measured at the substrate support impedance circuit and indirectly by the impact on film properties. The advantageous film properties associated with higher ionization, such as low stress and high density, start to deteriorate as a function of target life due to the increase in magnetic confinement.

Accordingly, the inventors have provided improved methods and apparatus for processing a substrate.

SUMMARY

Embodiments of the present disclosure include methods and apparatus for processing a substrate. In some embodiments, a method of depositing a metal-containing layer atop a substrate disposed in a physical vapor deposition (PVD) chamber includes: providing a plasma forming gas to a processing region of the PVD chamber; providing a first amount of RF power to a target assembly disposed opposite the substrate to form a plasma within the processing region of the PVD chamber; sputtering source material from the target assembly to deposit a metal-containing layer onto the substrate, wherein the source material is at a first erosion state; and tuning an auto capacitance tuner coupled to a substrate support while sputtering source material to maintain an ion energy at a surface of the substrate within a predetermined range as the target erodes from the first erosion state to a second erosion state.

In some embodiments, a method of depositing a metal-containing layer atop a substrate disposed in a physical vapor deposition (PVD) chamber includes: providing a plasma forming gas to a processing region of the PVD chamber; providing a first amount of RF power to a target assembly disposed opposite the substrate to form a plasma within the processing region of the PVD chamber; sputtering source material from the target assembly to deposit a metal-containing layer onto the substrate, wherein the source material is substantially uneroded at a first erosion state; and tuning an auto capacitance tuner coupled to a substrate support while sputtering source material to maintain an ion energy at a surface of the substrate within a predetermined range as the target erodes from the first erosion state to a second erosion state, wherein the source material at the second erosion state is substantially eroded.

In some embodiments, a computer readable medium is provided having instructions stored thereon that, when executed, cause a physical vapor deposition (PVD) chamber to perform a method of depositing a metal-containing layer atop a substrate. The method may include any of the embodiments disclosed herein.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The present disclosure relates to methods of processing a substrate. In some embodiments, the present disclosure relates to methods of depositing a metal-containing layer atop a substrate disposed in a physical vapor deposition process (PVD) chamber. In some embodiments, the inventive methods described herein advantageously facilitate the deposition of a metal-containing layer suitable as a hard mask layer, for example a titanium nitride layer, having improved stress, resistivity and density uniformity properties. For example, high density, low stress titanium nitride (TiN) films or the like, useful for back end of line (BEOL) hard mask applications, are used to reduce line bending for patterned low k dielectric trenches as well as improve low k etching profiles by reducing line edge roughness and critical dimension (CD) variation.

Figure 1:
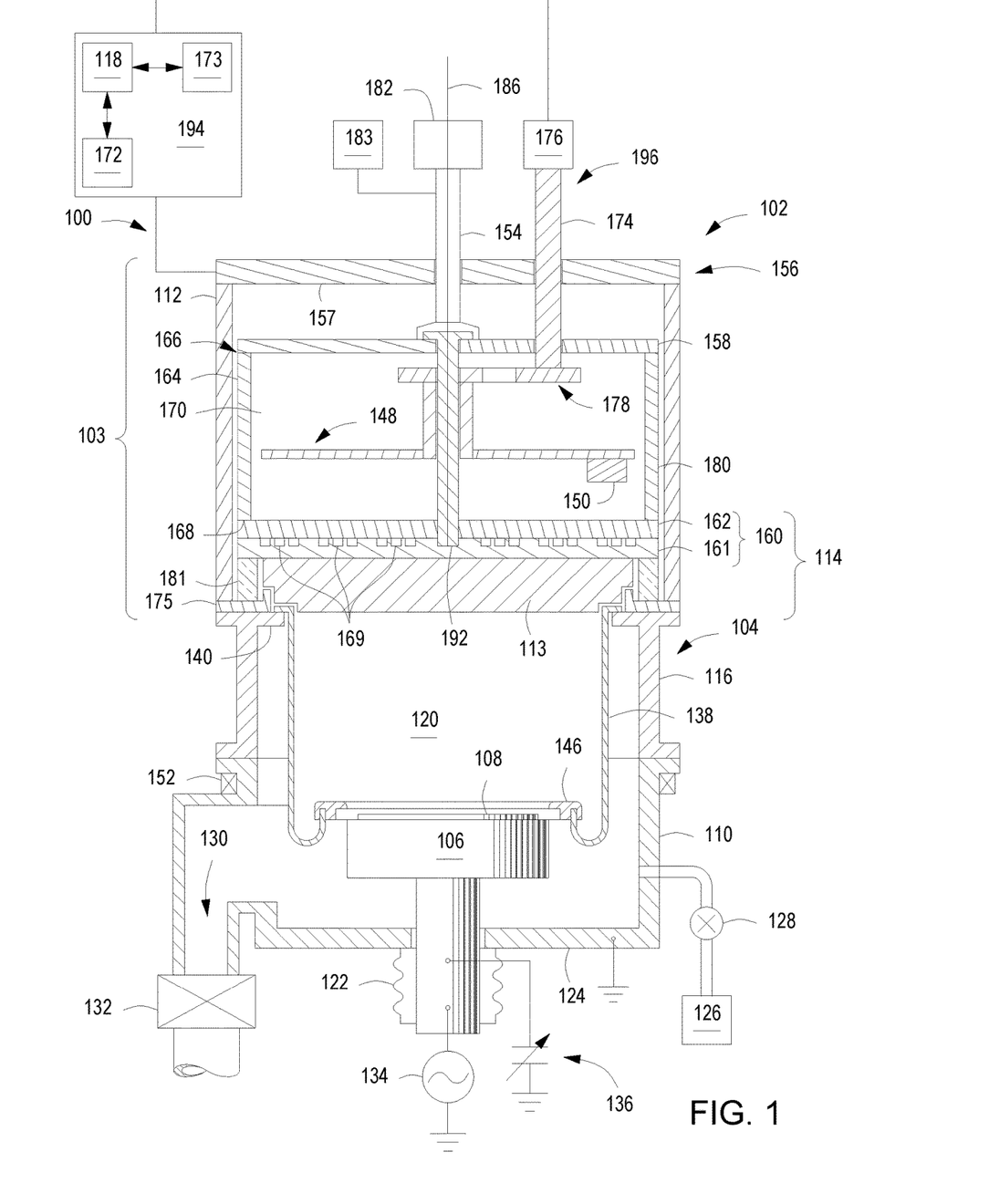
FIG. 1 depicts a schematic cross sectional view of a process chamber in accordance with some embodiments of the present disclosure.
Figure 2:
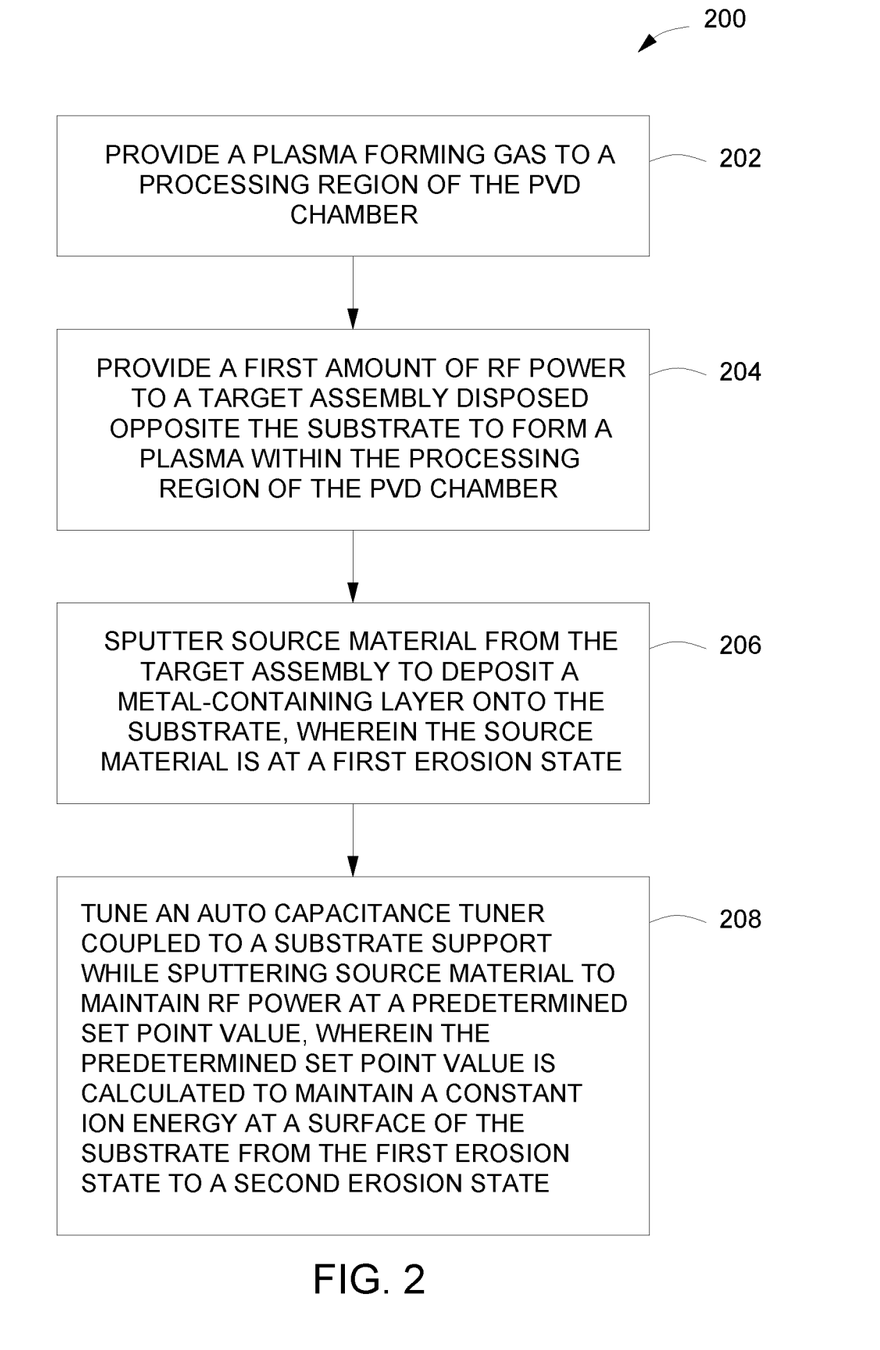
FIG. 2 depicts a flowchart of a method of processing a substrate in accordance with some embodiments of the present disclosure.

FIG. 1 depicts a simplified, cross-sectional view of a physical vapor deposition (PVD) processing system 100, in accordance with some embodiments of the present disclosure. FIG. 2 depicts a flow chart of a method 200 for depositing a layer atop a substrate disposed in a physical vapor deposition process system of the type described in FIG. 1. Examples of other PVD chambers suitable for performing the method 200 described herein include the CIRRUS™ and AVENIR™ PVD processing chambers, both commercially available from Applied Materials, Inc., of Santa Clara, Calif.

The method 200 is performed on a substrate 108 within a process chamber, for example the physical vapor deposition (PVD) process chamber (process chamber 104) shown in FIG. 1. The process chamber 104 depicted in FIG. 1 comprises a substrate support 106, a target assembly 114 having an optional backing plate assembly 160 and source material 113 which is disposed on a substrate support facing side of the backing plate assembly 160. The process chamber 104 further comprises a radio frequency (RF) power source 182 to provide RF energy to the target assembly 114.

The substrate 108 may be any suitable substrate having any suitable geometry, such as a round wafer, square, rectangular, or the like. The substrate 108 may comprise any suitable materials, such as one or more of silicon (Si), silicon oxide ($SiO_2$), silicon nitride (SiN), glass, other dielectric materials, or the like, and may have one or more layers of other materials disposed atop the substrate 108. In some embodiments, the substrate 108 may include an upper layer of a low k dielectric material, and in some embodiments, an ultra-low k dielectric material. As used herein ultra-low k dielectric materials include dielectric materials having a k value of less than or equal to about 2.5 . The substrate 108 may be a blank substrate (e.g., having no features disposed thereon), or the substrate 108 may have features formed in or on the substrate, such as vias or trenches, or high aspect ratio features, for example, for through silicon via (TSV) applications or the like. A high aspect ratio feature as used herein may include those features having a height to width aspect ratio of at least about 5:1 (e.g., a high aspect ratio).

The method 200 begins at 202, wherein a plasma forming gas is provided to a processing region 120 of the process chamber 104. The plasma-forming gas may include one or more inert gases, such as a noble gas, or other inert gases. For example, non-limiting examples of suitable plasma forming gases include one or more of argon (Ar), helium (He), xenon (Xe), neon (Ne), hydrogen ($H_2$), nitrogen ($N_2$), oxygen ($O_2$), or the like.

At 204, a first amount of RF power is provided to the target assembly 114 to ignite a plasma-forming gas into a plasma within the processing region 120 of the process chamber 104. The RF power is an amount of RF power suitable to form a plasma within the processing region 120 and may vary depending upon chamber size, geometry, or the like. For example, in some embodiments, the first amount of RF power is about 500 to about 20,000 watts. In some embodiments, the amount of RF power provided to the target assembly can be kept constant throughout the life of the target. In some embodiments, the amount of RF power can be increased over the life of the target to compensate for a reduced ionization rate within the plasma as the target erodes.

At 206, the source material 113 is sputtered from the target assembly 114 to deposit a metal-containing layer onto the substrate 108. The source material 113 is at a first erosion state when source material 113 is initially sputtered. In some embodiments, the source material 113 at the first erosion state is substantially uneroded (i.e. is at or very near the beginning of the target life). The source material 113 may comprise one or more of metals, metal alloys, or the like, suitable for forming a metal-containing layer on the substrate 108. For example, the source material 113 may comprise one or more of titanium (Ti), tantalum (Ta), copper (Cu), cobalt (Co), tungsten (W), aluminum (Al), or the like. Metal atoms from the source material 113 are sputtered using the plasma while maintaining a first pressure in the process chamber 104. The first pressure is a pressure sufficient to ionize a predominant portion of metal atoms being sputtered from the target assembly 114. The first pressure may be dependent on process chamber geometry (such as substrate size, target to substrate distance, and the like).

When depositing a metal-containing layer, such as a titanium nitride layer, the inventors have observed that increasing the ionization rate of nitrogen and titanium within the plasma by applying RF power to the target assembly 114 allows for improved surface mobility of arriving atoms, thus providing a crystallographic film orientation that is advantageous for forming low stress and dense films. In addition, a high fraction of ionized material arriving at the substrate 108 level allows for tuning of the incoming ion energy (i.e., the ion energy at the substrate surface) using a substrate support impedance circuit (e.g., auto capacitance tuner 136 described below with respect to FIG. 1 and FIG. 3) to control substrate current (e.g., ion energy at the substrate level) to further advantageously facilitate control over the crystallographic film orientation that is advantageous for forming low stress and dense films. The auto capacitance tuner 136 adjusts the capacitance (and thus impedance) from the substrate support pedestal electrode to ground. An exemplary substrate support impedance circuit (e.g., auto capacitance tuner 136) may provide a current of about 0.5 to about 20 amps. In addition to maintaining desirable film properties over the life of the target, the inventors have further observed that the useable target life can advantageously be increased from about 1000 kWh to about 4000 kWh when using methods in accordance with the present disclosure.

However, the inventors have also observed that the effectiveness of the RF power applied to the target assembly 114 is diminished as the target material erodes, resulting in a lessened ion density in the plasma. While the amount of RF power can be increased to compensate for the reduced ionization rate over the life of the target, the inventors have observed that such compensation alone is insufficient to maintain consistent deposited film properties over the life of the target. Without wishing to be bound by theory, the inventors believe that the reduction in the effectiveness of the RF power is due to the decrease in the physical distance from the surface of the magnet to the sputtering surface of the target as the target thins. Furthermore, the erosion track formed on the surface of the source material 113 from the sputtering process confines the electrons and thus decreases the plasma density at the substrate level. As the magnetic confinement increases, the electrons supplied by the RF current cannot propagate as efficiently into the plasma as they follow the strengthening (as a function of erosion depth) magnetic field lines, thus resulting in decreasing ion density as the target erodes. The inventors have further discovered that improved film property control can be advantageously achieved by controlling the ion energy over the course of target life and providing ion energy (e.g., current) compensation to provide a controlled amount of increase in ion energy at the substrate level to compensate for the decreasing ion density.

The PVD processing system 100 further comprises a substrate support impedance circuit, such as auto capacitance tuner 136, coupled to the substrate support 106 for adjusting the plasma sheath voltage at the substrate 108. For example, the auto capacitance tuner 136 may be used to control the sheath voltage at the substrate 108, and thus, the substrate current (e.g., ion energy at the substrate level). Thus, at 208, while sputtering the source material 113, the auto capacitance tuner 136 is tuned to maintain the amount of RF current at the substrate support at a predetermined set point value, or within a predetermined range of the predetermined set point value.

In some embodiments, tuning the auto capacitance tuner 136 comprises calculating the predetermined set point value and calculating the predetermined set point position. The predetermined set point position may be determined empirically or by modeling as the auto capacitance tuner 136 position with the highest current output.

The predetermined set point value is calculated to maintain a substantially constant ion energy at a surface of the substrate as the source material 113 erodes (i.e. goes from a first erosion state to a second erosion state). As used herein the term "substantially constant ion energy" refers to maintaining the ion energy at within 20 percent of the ion energy at the first erosion state, or within 10 percent of the ion energy at the first erosion state. In some embodiments, the predetermined set point value may be calculated to maintain the ion energy at the surface of the substrate at between about 10 to about 20 percent of the ion energy at the surface of the substrate while the target is at the first erosion state. For example, the predetermined set point value may be calculated by determining a pre-defined target life-based compensation coefficient ("coefficient"). The coefficient may be determined empirically or by modeling based on the life of the target to maintain a constant ion energy at a surface of the substrate when the source material 113 is at a second erosion state (e.g., more eroded than the first erosion state). The coefficient is the difference in the current from the start of the target life to the end of the target life needed to maintain equivalent film properties from the start of target life to the end of target life divided by the percentage of target life used. The coefficient may be stored in the controller 194, as described below and depicted in FIG. 1. In some embodiments, the source material 113 at the second erosion state is substantially eroded (i.e., is at or very near the end of the target life). In some embodiments, the source material 113 at the first erosion state is substantially uneroded (i.e., is unused and ready to begin processing substrates), and the source material 113 at the second erosion state is substantially eroded (i.e., is at or very near the end of the target life).

Accordingly, in some embodiments, the current across the auto capacitance tuner 136 may be measured to determine the ion energy at the substrate and the position or set point of the auto capacitance tuner 136 can be adjusted if necessary in response to the measured current in order to maintain the ion energy at the substrate at the desired level as described above. Alternatively or in combination, the bias voltage on the substrate can be measured (and correlated to the ion energy at the substrate empirically or by modelling) and used to determine whether the actual ion energy needs to be increased or decreased (and the auto capacitance tuner 136 adjusted) to maintain the ion energy at the substrate at the desired level.

In some embodiments, tuning the auto capacitance tuner 136 comprises comparing a position of the auto capacitance tuner 136 to the predetermined set point position. In some embodiments, the position of the auto capacitance tuner 136 is greater than the predetermined set point position, and the amount of RF power controlled by the auto capacitance tuner 136 (ion current at the substrate level as measured by the current from the auto capacitance tuner 136) is less than the predetermined set point value. In such embodiments, the position of the auto capacitance tuner 136 is decreased until the amount of RF power (current measured at the auto capacitance tuner 136) controlled by the auto capacitance tuner 136 equals the predetermined set point value.

In some embodiments, the position of the auto capacitance tuner 136 is greater than the predetermined set point position, and the amount of RF power controlled by the auto capacitance tuner 136 (ion current at the substrate level as measured by the current from the auto capacitance tuner 136) is greater than the predetermined set point value. In such embodiments, the position of the auto capacitance tuner 136 is increased until the amount of RF power (current measured at the auto capacitance tuner 136) controlled by the auto capacitance tuner 136 equals the predetermined set point value.

In some embodiments, the position of the auto capacitance tuner 136 is less than the predetermined set point position and the amount of RF power controlled by the auto capacitance tuner 136 (ion current at the substrate level as measured by the current from the auto capacitance tuner 136) is less than the predetermined set point value. In such embodiments, the position of the auto capacitance tuner 136 is increased until the amount of RF power (current measured at the auto capacitance tuner 136) controlled by the auto capacitance tuner 136 equals the predetermined set point value.

In some embodiments, the position of the auto capacitance tuner 136 is less than the predetermined set point position and the amount of RF power controlled by the auto capacitance tuner 136 (ion current at the substrate level as measured by the current from the auto capacitance tuner 136) is greater than the predetermined set point value. In such embodiments, the position of the auto capacitance tuner 136 is decreased until the amount of RF power (current measured at the auto capacitance tuner 136) controlled by the auto capacitance tuner 136 equals the predetermined set point value.

Figure 4:
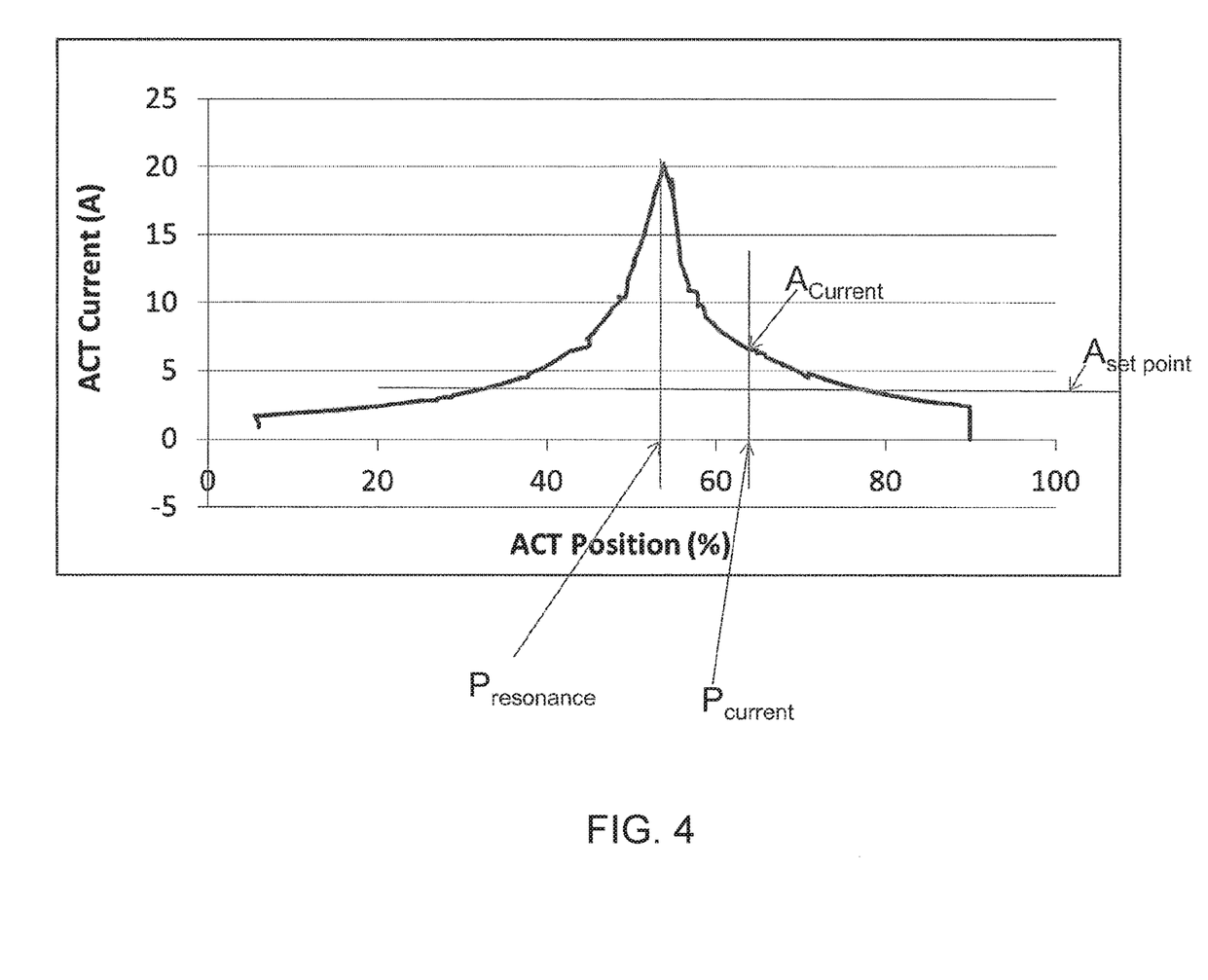
FIG. 4 depicts an illustrative auto capacitance tuner resonance curve in accordance with some embodiments of the present disclosure.

FIG. 4 depicts an exemplary auto capacitance tuner resonance curve in accordance with some embodiments of tuning the auto capacitance tuner 136, comparing a position of the auto capacitance tuner 136 to a predetermined set point position. The position of the auto capacitance tuner 136 is shown as $P_{current}$ in FIG. 4. The predetermined set point position is shown as $P_{resonance}$ in FIG. 4 and corresponds to the position of the auto capacitance tuner 136 that yields the highest current. As described above, the position of the auto capacitance tuner 136 ($P_{current}$) can be greater or less than the predetermined set point position ($P_{resonance}$). FIG. 4 illustratively depicts the position of the auto capacitance tuner 136 ($P_{current}$) as greater than the predetermined set point position ($P_{resonance}$). The amount of RF power controlled by the auto capacitance tuner 136 (ion current at the substrate level as measured by the current from the auto capacitance tuner 136) is shown as $A_{current}$ in FIG. 4. The predetermined set point value is shown as $A_{set\ point}$ in FIG. 4. As described above, the ion current at the substrate level as measured by the current from the auto capacitance tuner 136 ($A_{current}$ in FIG. 4) can be greater or less than the predetermined set point value ($A_{set\ point}$). Accordingly, the position of the auto capacitance tuner 136 ($P_{current}$) can be increased or decreased until the current measured at the auto capacitance tuner 136 ($A_{current}$) equals the predetermined set point value ($A_{set\ point}$). FIG. 4 depicts an embodiment where the $A_{current}$ is greater than the $A_{set\ point}$. Accordingly, the position of the auto capacitance tuner 136 ($P_{current}$) can be increased until the amount of current measured at the auto capacitance tuner 136 ($A_{current}$) equals the predetermined set point value ($A_{set\ point}$).

In some embodiments, a controller 194, as described below and depicted in FIG. 1, may be provided and coupled to various components of the PVD processing system 100 to control the operation thereof. In some embodiments, the controller 194 is coupled to the auto capacitance tuner 136. In some embodiments, the auto capacitance tuner 136 is coupled to the controller 194 using a digital communication mechanism to improve the accuracy of the communication between the auto capacitance tuner 136 and the controller 194 as compared to analog communication mechanisms.

Figure 3:
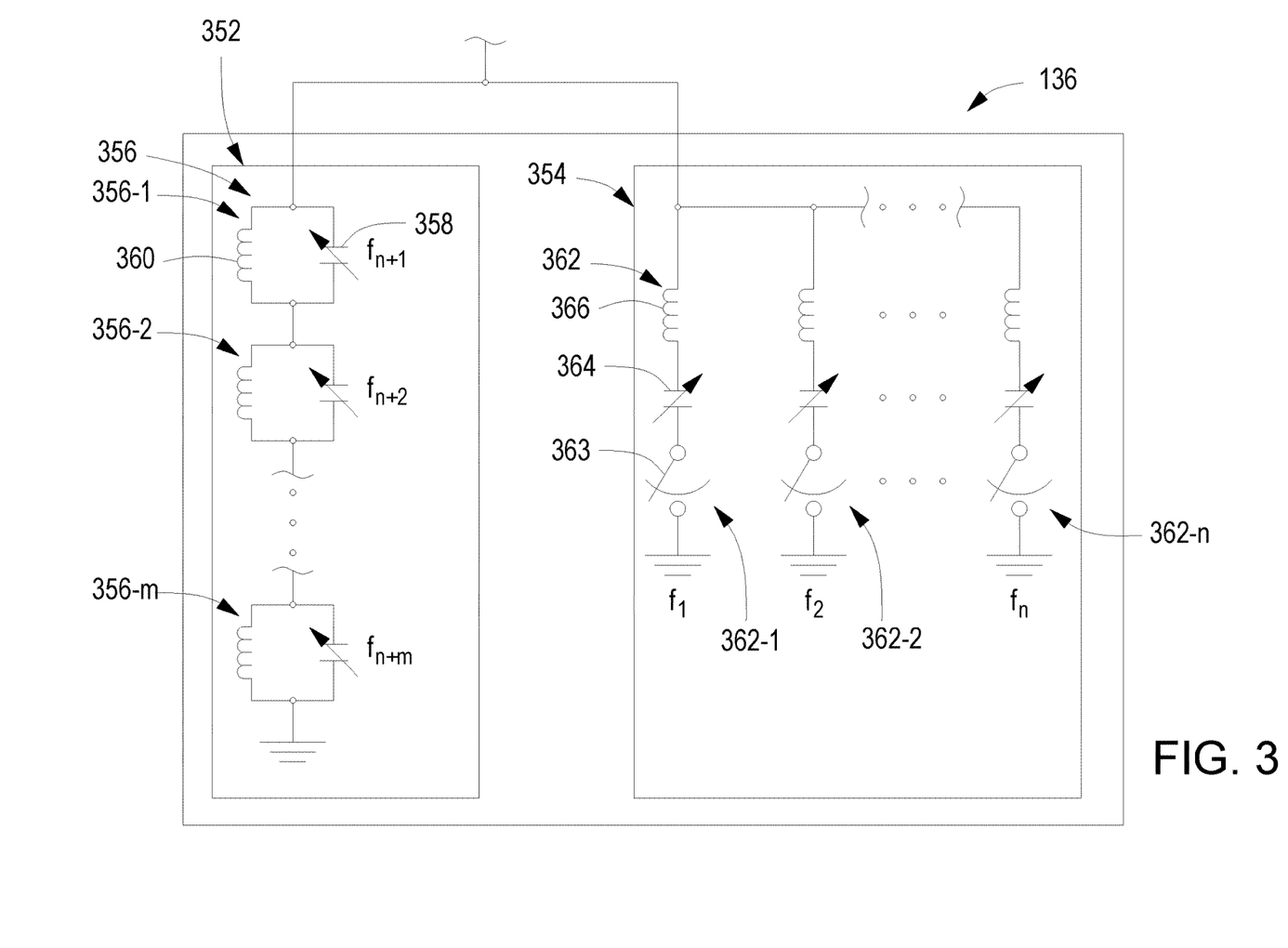
FIG. 3 depicts a circuit implementation of an auto capacitance tuner in accordance with some embodiments of the present disclosure.

FIG. 3 depicts one embodiment of an auto capacitance tuner 136. Further embodiments of a suitable auto capacitance tuner are described in commonly owned U.S. Patent Publication No. 2011/0209995, to Rasheed, et al., and published Sep. 1, 2011. In FIG. 3, the auto capacitance tuner 136 includes an array of variable band reject ("notch") filters (i.e. notch filter array 352) and an array of variable band pass ("pass") filters (i.e. pass filter array 354). The notch filter array 352 consists of many notch filters, each notch filter blocking a narrow frequency band, one notch filter being provided for each frequency of interest. The impedance presented by each notch filter may be variable, to provide full control of impedances for each frequency of interest. The frequencies of interest include the bias frequency fb, the source frequency fs, harmonics of fs, harmonics of fb, intermodulation products of fs and fb and the harmonics of the intermodulation products. The pass filter array 354 consists of many pass filters, each pass filter passing (presenting a low impedance to) a narrow frequency band, one pass filter being provided for each frequency of interest. The impedance presented by each notch filter may be variable, to provide full control of impedances for each frequency of interest. The frequencies of interest include the bias frequency fb, the source frequency fs, harmonics of fs, harmonics of fb, intermodulation products of fs and fb, and harmonics of the intermodulation products.

FIG. 3 depicts the auto capacitance tuner 136 with one implementation of the notch filter array 352 and the pass filter array 354. The notch filter array 352 includes a set of m (where m is an integer) individual notch filters 356-1 through 356-m connected in series. Each individual notch filter 356 consists of a variable capacitor 358 of capacitance C and an inductor 360 of inductance L, the individual notch filter having a resonant frequency $fr=1/[2\pi(LC)^{1/2}]$. The reactances L and C of each notch filter 356 are different and are selected so that the resonant frequency fr of a particular notch filter corresponds to one of the frequencies of interest, each notch filter 356 having a different resonant frequency. The resonant frequency of each notch filter 356 is the center of the narrow band of frequencies blocked by the notch filter 356. The pass filter array 354 of FIG. 3 includes a set of n (where n is an integer) individual pass filters 362-1 through 362-n connected in parallel. Each individual pass filter 362 consists of a variable capacitor 364 of capacitance C and an inductor 366 of inductance L, the pass filter 362 having a resonant frequency $fr=1/[2\pi(LC)^{1/2}]$. Optionally, each pass filter 362 may include, in addition, a series switch 363 to permit the pass filter to be disabled. The reactances L and C of each pass filter 362 are different and are selected so that the resonant frequency fr corresponds to one of the frequencies of interest, each pass filter 362 having a different resonant frequency. The resonant frequency of each pass filter 362 is the center of the narrow band of frequencies passed or admitted by the pass filter 362. In the implementation of FIG. 3, there are n pass filters 362 in the pass filter array 354 and m notch filters in the notch filter array 352.

Returning to FIG. 1, a second energy source 183, optionally coupled to the target assembly 114, may provide DC power to the target assembly 114 to direct the plasma towards the target assembly 114. In some embodiments, the DC power may range from about 1 to about 20 kilowatts (kW), although the amount of DC power applied may vary depending upon chamber geometry (e.g., target size or the like). In some embodiments, the DC power may also be adjusted over the life of the target in the same manner as described above for the RF power. The DC power may be adjusted to control the deposition rate of sputtered metal atoms on the substrate. For example, increasing the DC power can result in increased interaction of the plasma with the source material 113 and increased sputtering of metal atoms from the target assembly 114. In some embodiments, the DC power may be adjusted to maintain a ratio of DC power to RF power of about 2:1 to about 10:1.

The PVD processing system 100 includes a chamber lid 102 removably disposed atop a process chamber 104. The chamber lid 102 may include the target assembly 114 and a grounding assembly 103. The process chamber 104 contains a substrate support 106 for receiving a substrate 108. The substrate support 106 may be located within a lower grounded enclosure wall 110, which may be a chamber wall of the process chamber 104. The lower grounded enclosure wall 110 may be electrically coupled to the grounding assembly 103 of the chamber lid 102 such that an RF return path is provided to an RF power source 182 disposed above the chamber lid 102. The RF power source 182 may provide RF energy to the target assembly 114 as discussed below. Alternatively or in combination a DC power source may be similarly coupled to target assembly 114.

The PVD processing system 100 may include a source distribution plate 158 opposing a backside of the target assembly 114 and electrically coupled to the target assembly 114 along a peripheral edge of the target assembly 114. The PVD processing system 100 may include a cavity 170 disposed between the backside of the target assembly 114 and the source distribution plate 158. The cavity 170 may at least partially house a magnetron assembly 196 as discussed below. The cavity 170 is at least partially defined by the inner surface of a conductive support ring 164, a target facing surface of the source distribution plate 158, and a source distribution plate facing surface (e.g., backside) of the target assembly 114 (or backing plate assembly 160).

The PVD processing system 100 further includes a magnetron assembly 196. The magnetron assembly 196 provides a rotating magnetic field proximate the target assembly 114 to assist in plasma processing within the process chamber 104. The magnetron assembly includes a rotatable magnet assembly 148 disposed within the cavity 170. The rotatable magnet assembly 148 rotates about a central axis 186 of the process chamber 104.

In some embodiments, the magnetron assembly 196 includes a motor 176, a motor shaft 174, a gear assembly 178, and the rotatable magnet assembly 148. The rotatable magnet assembly 148 includes a plurality of magnets 150 and is configured to rotate the plurality of magnets 150 about the central axis 186 as described below. The motor 176 may be an electric motor, a pneumatic or hydraulic drive, or any other process-compatible mechanism that can provide suitable torque. While one illustrative embodiment is described herein to illustrate how the rotatable magnet assembly 148 may be rotated, other configurations may also be used.

In use, the magnetron assembly 196 rotates the rotatable magnet assembly 148 within the cavity 170. For example, in some embodiments, the motor 176, motor shaft 174, and gear assembly 178 may be provided to rotate the rotatable magnet assembly 148. In some embodiments, the electrode 154 is aligned with the central axis 186 of the process chamber 104, and motor shaft 174 of the magnetron may be disposed through an off-center opening in the ground plate 156. The end of the motor shaft 174 protruding from the ground plate 156 is coupled to the motor 176. The motor shaft 174 is further disposed through an off-center opening in the source distribution plate 158 and coupled to a gear assembly 178.

The gear assembly 178 may be supported by any suitable means, such as by being coupled to a bottom surface of the source distribution plate 158. The gear assembly 178 may be insulated from the source distribution plate 158 by fabricating at least the upper surface of the gear assembly 178 from a dielectric material, or by interposing an insulator layer (not shown) between the gear assembly 178 and the source distribution plate 158, or the like, or by constructing the motor shaft 174 out of suitable dielectric material. The gear assembly 178 is further coupled to the rotatable magnet assembly 148 to transfer the rotational motion provided by the motor 176 to the rotatable magnet assembly 148. The gear assembly 178 may be coupled to the rotatable magnet assembly 148 through the use of pulleys, gears, or other suitable means of transferring the rotational motion provided by the motor 176.

The substrate support 106 has a material-receiving surface facing a principal surface of a target assembly 114 and supports the substrate 108 to be sputter coated in planar position opposite to the principal surface of the target assembly 114. The substrate support 106 may support the substrate 108 in a processing region 120 of the process chamber 104. The processing region 120 is defined as the region above the substrate support 106 during processing (for example, between the target assembly 114 and the substrate support 106 when in a processing position).

In some embodiments, the substrate support 106 may be vertically movable to allow the substrate 108 to be transferred onto the substrate support 106 through a load lock valve (not shown) in the lower portion of the process chamber 104 and thereafter raised to a deposition, or processing position. A bellows 122 connected to a bottom chamber wall 124 may be provided to maintain a separation of the inner volume of the process chamber 104 from the atmosphere outside of the process chamber 104 while facilitating vertical movement of the substrate support 106. One or more gases may be supplied from a gas source 126 through a mass flow controller 128 into the lower part of the process chamber 104. An exhaust port 130 may be provided and coupled to a pump (not shown) via a valve 132 for exhausting the interior of the process chamber 104 and to facilitate maintaining a suitable pressure inside the process chamber 104.

In some embodiments, an RF bias power source 134 may be coupled to the substrate support 106 in order to induce a negative DC bias on the substrate 108. In addition, in some embodiments, a negative DC self-bias may form on the substrate 108 during processing. For example, RF energy supplied by the RF bias power source 134 may range in frequency from about 2 MHz to about 60 MHz, for example, non-limiting frequencies such as 2 MHz, 13.56 MHz, or 60 MHz can be used. In some embodiments, RF bias power may be supplied in a range from about 100 W to about 2 kW. In some embodiments, DC power may be supplied in range from about 2 kW to about 40 kW. In other applications, the substrate support 106 may be grounded or left electrically floating.

The process chamber 104 further includes a process kit shield, or shield, 138 to surround the processing volume, or central region, of the process chamber 104 and to protect other chamber components from damage and/or contamination from processing. In some embodiments, the shield 138 may be connected to a ledge 140 of an upper grounded enclosure wall 116 of the process chamber 104. As illustrated in FIG. 1, the chamber lid 102 may rest on the ledge 140 of the upper grounded enclosure wall 116. Similar to the lower grounded enclosure wall 110, the upper grounded enclosure wall 116 may provide a portion of the RF return path between the lower grounded enclosure wall 116 and the grounding assembly 103 of the chamber lid 102. However, other RF return paths are possible, such as via the grounded shield 138.

The shield 138 extends downwardly and may include a generally tubular portion having a generally constant diameter that generally surrounds the processing region 120. The shield 138 extends along the walls of the upper grounded enclosure wall 116 and the lower grounded enclosure wall 110 downwardly to below a top surface of the substrate support 106 and returns upwardly until reaching a top surface of the substrate support 106 (e.g., forming a u-shaped portion at the bottom of the shield 138). A cover ring 146 rests on the top of an upwardly extending inner portion of the shield 138 when the substrate support 106 is in the lower, loading position but rests on the outer periphery of the substrate support 106 when the substrate support is in the upper, deposition position to protect the substrate support 106 from sputter deposition. An additional deposition ring (not shown) may be used to protect the edges of the substrate support 106 from deposition around the edge of the substrate 108.

In some embodiments, a magnet 152 may be disposed about the process chamber 104 for selectively providing a magnetic field between the substrate support 106 and the target assembly 114. For example, as shown in FIG. 1, the magnet 152 may be disposed about the outside of the enclosure wall 110 in a region just above the substrate support 106 when in processing position. In some embodiments, the magnet 152 may be disposed additionally or alternatively in other locations, such as adjacent the upper grounded enclosure wall 116. The magnet 152 may be an electromagnet and may be coupled to a power source (not shown) for controlling the magnitude of the magnetic field generated by the electromagnet.

The chamber lid 102 generally includes the grounding assembly 103 disposed about the target assembly 114. The grounding assembly 103 may include a grounding plate 156 having a first surface 157 that may be generally parallel to and opposite a backside of the target assembly 114. A grounding shield 112 may extending from the first surface 157 of the grounding plate 156 and surround the target assembly 114. The grounding assembly 103 may include a support member 175 to support the target assembly 114 within the grounding assembly 103.

In some embodiments, the support member 175 may be coupled to a lower end of the grounding shield 112 proximate an outer peripheral edge of the support member 175 and extends radially inward to support a seal ring 181, and the target assembly 114. The seal ring 181 may be a ring or other annular shape having a suitable cross-section. The seal ring 181 may include two opposing planar and generally parallel surfaces to facilitate interfacing with the target assembly 114, such as the backing plate assembly 160, on a first side of the seal ring 181 and with the support member 175 on a second side of the seal ring 181. The seal ring 181 may be made of a dielectric material, such as ceramic. The seal ring 181 may insulate the target assembly 114 from the ground assembly 103.

The support member 175 may be a generally planar member having a central opening to accommodate the target assembly 114. In some embodiments, the support member 175 may be circular, or disc-like in shape, although the shape may vary depending upon the corresponding shape of the chamber lid and/or the shape of the substrate to be processed in the PVD processing system 100.

The target assembly 114 may comprise a source material 113, such as a metal, metal oxide, metal alloy, or the like, to be deposited on a substrate, such as the substrate 108 during sputtering. In some embodiments, the target assembly 114 may be fabricated substantially from the source material 113, without any backing plate to support the source material 113. In some embodiments, the target assembly 114 includes a backing plate assembly 160 to support the source material 113. The source material 113 may be disposed on a substrate support facing side of the backing plate assembly 160 as illustrated in FIG. 1. The backing plate assembly 160 may comprise a conductive material, such as copper-zinc, copper-chrome, or the same material as the target, such that RF and DC power can be coupled to the source material 113 via the backing plate assembly 160. Alternatively, the backing plate assembly 160 may be non-conductive and may include conductive elements (not shown) such as electrical feedthroughs or the like.

In some embodiments, the backing plate assembly 160 includes a first backing plate 161 and a second backing plate 162. The first backing plate 161 and the second backing plate 162 may be disc shaped, rectangular, square, or any other shape that may be accommodated by the PVD processing system 100. A front side of the first backing plate 161 is configured to support the source material 113 such that a front surface of the source material opposes the substrate 108 when present. The source material 113 may be coupled to the first backing plate 161 in any suitable manner. For example, in some embodiments, the source material 113 may be diffusion bonded to the first backing plate 161.

A plurality of sets of channels 169 may be disposed between the first and second backing plates 161, 162. The first and second backing plates 161, 162 may be coupled together to form a substantially water tight seal (e.g., a fluid seal between the first and second backing plates) to prevent leakage of coolant provided to the plurality of sets of channels 169. In some embodiments, the target assembly 114 may further comprise a central support member 192 to support the target assembly 114 within the process chamber 104.

In some embodiments, the conductive support ring 164 may be disposed between the source distribution plate 158 and the backside of the target assembly 114 to propagate RF energy from the source distribution plate to the peripheral edge of the target assembly 114. The conductive support ring 164 may be cylindrical, with a first end 166 coupled to a target-facing surface of the source distribution plate 158 proximate the peripheral edge of the source distribution plate 158 and a second end 168 coupled to a source distribution plate-facing surface of the target assembly 114 proximate the peripheral edge of the target assembly 114. In some embodiments, the second end 168 is coupled to a source distribution plate facing surface of the backing plate assembly 160 proximate the peripheral edge of the backing plate assembly 160.

An insulative gap 180 is provided between the grounding plate 156 and the outer surfaces of the source distribution plate 158, the conductive support ring 164, and the target assembly 114 (and/or backing plate assembly 160). The insulative gap 180 may be filled with air or some other suitable dielectric material, such as a ceramic, a plastic, or the like. The distance between the grounding plate 156 and the source distribution plate 158 depends on the dielectric material between the grounding plate 156 and the source distribution plate 158. Where the dielectric material is predominantly air, the distance between the grounding plate 156 and the source distribution plate 158 may be between about 15 mm and about 40 mm.

The grounding assembly 103 and the target assembly 114 may be electrically separated by the seal ring 181 and by one or more of insulators (not shown) disposed between the first surface 157 of the grounding plate 156 and the backside of the target assembly 114, e.g., a non-target facing side of the source distribution plate 158.

The PVD processing system 100 has an RF power source 182 connected to an electrode 154 (e.g., a RF feed structure). The electrode 154 may pass through the grounding plate 156 and is coupled to the source distribution plate 158. The RF power source 182 may include an RF generator and a matching circuit, for example, to minimize reflected RF energy reflected back to the RF generator during operation. For example, RF energy supplied by the RF power source 182 may range in frequency from about 13.56 MHz to about 162 MHz or above. For example, non-limiting frequencies such as 13.56 MHz, 27.12 MHz, 40.68 MHz, 60 MHz, or 162 MHz can be used.

In some embodiments, PVD processing system 100 may include a second energy source 183 to provide additional energy to the target assembly 114 during processing. In some embodiments, the second energy source 183 may be a DC power source to provide DC energy, for example, to enhance a sputtering rate of the target material (and hence, a deposition rate on the substrate). In some embodiments, the second energy source 183 may be a second RF power source, similar to the RF power source 182, to provide RF energy, for example, at a second frequency different than a first frequency of RF energy provided by the RF power source 182. In embodiments where the second energy source 183 is a DC power source, the second energy source may be coupled to the target assembly 114 in any location suitable to electrically couple the DC energy to the target assembly 114, such as the electrode 154 or some other conductive member (such as the source distribution plate 158, discussed below). In embodiments where the second energy source 183 is a second RF power source, the second energy source may be coupled to the target assembly 114 via the electrode 154.

The electrode 154 may be cylindrical or otherwise rod-like and may be aligned with a central axis 186 of the process chamber 104 (e.g., the electrode 154 may be coupled to the target assembly at a point coincident with a central axis of the target, which is coincident with the central axis 186). The electrode 154, aligned with the central axis 186 of the process chamber 104, facilitates applying RF energy from the RF power source 182 to the target assembly 114 in an axisymmetrical manner (e.g., the electrode 154 may couple RF energy to the target at a "single point" aligned with the central axis of the PVD chamber). The central position of the electrode 154 helps to eliminate or reduce deposition asymmetry in substrate deposition processes. The electrode 154 may have any suitable diameter. For example, although other diameters may be used, in some embodiments, the diameter of the electrode 154 may be about 0.5 to about 2 inches. The electrode 154 may generally have any suitable length depending upon the configuration of the PVD chamber. In some embodiments, the electrode may have a length of between about 0.5 to about 12 inches. The electrode 154 may be fabricated from any suitable conductive material, such as aluminum, copper, silver, or the like. Alternatively, in some embodiments, the electrode 154 may be tubular. In some embodiments, the diameter of the tubular electrode 154 may be suitable, for example, to facilitate providing a central shaft for the magnetron.

The electrode 154 may pass through the ground plate 156 and is coupled to the source distribution plate 158. The ground plate 156 may comprise any suitable conductive material, such as aluminum, copper, or the like. The open spaces between the one or more insulators (not shown) allow for RF wave propagation along the surface of the source distribution plate 158. In some embodiments, the one or more insulators may be symmetrically positioned with respect to the central axis 186 of the PVD processing system. Such positioning may facilitate symmetric RF wave propagation along the surface of the source distribution plate 158 and, ultimately, to a target assembly 114 coupled to the source distribution plate 158. The RF energy may be provided in a more symmetric and uniform manner as compared to conventional PVD chambers due, at least in part, to the central position of the electrode 154.

A controller 194 may be provided and coupled to various components of the PVD processing system 100 to control the operation thereof. The controller 194 includes a central processing unit (CPU) 118, a memory 172, and support circuits 173. The controller 194 may control the PVD processing system 100 directly, or via computers (or controllers) associated with particular process chamber and/or support system components. The controller 194 may be one of any form of general-purpose computer processor that can be used in an industrial setting for controlling various chambers and sub-processors. The memory, or computer readable medium, 172 of the controller 194 may be one or more of readily available memory such as random access memory (RAM), read only memory (ROM), floppy disk, hard disk, optical storage media (e.g., compact disc or digital video disc), flash drive, or any other form of digital storage, local or remote. The support circuits 173 are coupled to the CPU 118 for supporting the processor in a conventional manner. These circuits include cache, power supplies, clock circuits, input/output circuitry and subsystems, and the like. Inventive methods as described herein may be stored in the memory 264 as software routine that may be executed or invoked to control the operation of the PVD processing system 100 in the manner described herein. The software routine may also be stored and/or executed by a second CPU (not shown) that is remotely located from the hardware being controlled by the CPU 118.

While the foregoing is directed to particular embodiments of the present disclosure, other and further embodiments of the disclosure may be devised without departing from the basic scope of the disclosure.

The invention claimed is:

1. A method of depositing a metal-containing layer atop a substrate disposed in a physical vapor deposition (PVD) chamber, comprising:
   providing a plasma forming gas to a processing region of the PVD chamber;
   providing a first amount of RF power to a target assembly having a target with a target life disposed opposite the substrate to form a plasma within the processing region of the PVD chamber;
   sputtering source material from the target assembly to deposit a metal-containing layer onto the substrate, wherein the source material is at a first erosion state; and
   tuning an auto capacitance tuner coupled to a substrate support while sputtering source material to maintain an ion energy at a surface of the substrate within a predetermined range as the target erodes from the first erosion state to a second erosion state, wherein tuning the auto capacitance tuner comprises comparing a position of the auto capacitance tuner to a predetermined set point position of the auto capacitance tuner, wherein predetermined set point value is calculated by determining a pre-defined target life-based compensation coefficient, and wherein the pre-defined target life-based compensation coefficient is determined based on the life of the target to maintain the ion energy within the predetermined range at a surface of the substrate while the target erodes from the first erosion state to the second erosion state.

2. The method of claim 1, wherein an amount of ion energy at the substrate controlled by the auto capacitance tuner is less than the predetermined set point value, and wherein tuning the auto capacitance tuner further comprises decreasing the position of the auto capacitance tuner until the amount of current measured at the auto capacitance tuner equals the predetermined set point value.

3. The method of claim 1, wherein an amount of ion energy at the substrate controlled by the auto capacitance tuner is greater than the predetermined set point value, and wherein tuning the auto capacitance tuner further comprises increasing the position of the auto capacitance tuner until the amount of current measured at the auto capacitance tuner equals the predetermined set point value.

4. The method of claim 1, wherein an amount of ion energy at the substrate controlled by the auto capacitance tuner is less than the predetermined set point value, and wherein tuning the auto capacitance tuner further comprises increasing the position of the auto capacitance tuner until the amount of current measured at the auto capacitance tuner equals the predetermined set point value.

5. The method of claim 1, wherein an amount of ion energy at the substrate controlled by the auto capacitance tuner is greater than the predetermined set point value, and wherein tuning the auto capacitance tuner further comprises decreasing the position of the auto capacitance tuner until the amount of current measured at the auto capacitance tuner equals the predetermined set point value.

6. The method of claim 1, wherein the source material at the first erosion state is substantially uneroded.

7. The method of claim 1, wherein the source material at the second erosion state is substantially eroded.

8. The method of claim 1, wherein the source material is one of titanium (Ti), tantalum (Ta), copper (Cu), cobalt (Co), tungsten (W), or aluminum (Al).

9. The method of claim 1, wherein the plasma forming gas comprises one or more of argon (Ar), helium (He), xenon (Xe), neon (Ne), hydrogen ($H_2$), nitrogen ($N_2$), oxygen ($O_2$).

10. The method of claim 1, wherein the first amount of RF power is about 500 W to about 20,000 W.

11. A method of depositing a metal-containing layer atop a substrate disposed in a physical vapor deposition (PVD) chamber, comprising:
  providing a plasma forming gas to a processing region of the PVD chamber;
  providing a first amount of RF power to a target assembly having a target with a target life disposed opposite the substrate to form a plasma within the processing region of the PVD chamber;
  sputtering source material from the target assembly to deposit a metal-containing layer onto the substrate, wherein the source material is substantially uneroded at a first erosion state; and
  tuning an auto capacitance tuner coupled to a substrate support while sputtering source material to maintain an ion energy at a surface of the substrate within a predetermined range as the target erodes from the first erosion state to a second erosion state, wherein the source material at the second erosion state is substantially eroded, wherein tuning the auto capacitance tuner comprises comparing a position of the auto capacitance tuner to a predetermined set point position of the auto capacitance tuner, wherein predetermined set point value is calculated by determining a pre-defined target life-based compensation coefficient, and wherein the pre-defined target life-based compensation coefficient is determined based on the life of the target to maintain the ion energy within the predetermined range at a surface of the substrate while the target erodes from the first erosion state to the second erosion state.

12. The method of claim 11, wherein an amount of ion energy at the substrate controlled by the auto capacitance tuner is less than the predetermined set point value, and wherein tuning the auto capacitance tuner further comprises decreasing the position of the auto capacitance tuner until the amount of current measured at the auto capacitance tuner equals the predetermined set point value.

13. The method of claim 11, wherein an amount of ion energy at the substrate controlled by the auto capacitance tuner is greater than the predetermined set point value, and wherein tuning the auto capacitance tuner further comprises increasing the position of the auto capacitance tuner until the amount of current measured at the auto capacitance tuner equals the predetermined set point value.

14. The method of claim 11, wherein an amount of ion energy at the substrate controlled by the auto capacitance tuner is less than the predetermined set point value, and wherein tuning the auto capacitance tuner further comprises increasing the position of the auto capacitance tuner until the amount of current measured at the auto capacitance tuner equals the predetermined set point value.

15. The method of claim 11, wherein an amount of ion energy at the substrate controlled by the auto capacitance tuner is greater than the predetermined set point value, and wherein tuning the auto capacitance tuner further comprises decreasing the position of the auto capacitance tuner until the amount of current measured at the auto capacitance tuner equals the predetermined set point value.

16. The method of claim 11, wherein the source material is one of titanium (Ti), tantalum (Ta), copper (Cu), cobalt (Co), tungsten (W), or aluminum (Al).

17. The method of claim 11, wherein the plasma forming gas comprises one or more of argon (Ar), helium (He), xenon (Xe), neon (Ne), hydrogen ($H_2$), nitrogen ($N_2$), oxygen ($O_2$).

18. A computer readable medium, having instructions stored thereon that, when executed, cause a physical vapor deposition (PVD) chamber to perform a method of depositing a metal-containing layer atop a substrate, the method comprising:
  providing a plasma forming gas to a processing region of the PVD chamber;
  providing a first amount of RF power to a target assembly having a target with a target life disposed opposite the substrate to form a plasma within the processing region of the PVD chamber;
  sputtering source material from the target assembly to deposit a metal-containing layer onto the substrate, wherein the source material is at a first erosion state; and
  tuning an auto capacitance tuner coupled to a substrate support while sputtering source material to maintain an ion energy at a surface of the substrate within a predetermined range as the target erodes from the first erosion state to at a second erosion state, wherein tuning the auto capacitance tuner comprises comparing a position of the auto capacitance tuner to a predetermined set point position of the auto capacitance tuner, wherein predetermined set point value is calculated by determining a pre-defined target life-based compensation coefficient, and wherein the pre-defined target life-based compensation coefficient is determined based on the life of the target to maintain the ion energy within the predetermined range at a surface of the substrate while the target erodes from the first erosion state to the second erosion state.

19. The method of claim 1, wherein the pre-defined target life-based compensation coefficient is the difference in current from the start of the target life to the end of the target life needed to maintain equivalent film properties from the start of target life to the end of target life divided by the percentage of target life used.

20. The method of claim 11, wherein the pre-defined target life-based compensation coefficient is the difference in current from the start of the target life to the end of the target life needed to maintain equivalent film properties from the start of target life to the end of target life divided by the percentage of target life used.

* * * * *